(12) United States Patent
Li et al.

(10) Patent No.: US 7,367,109 B2
(45) Date of Patent: May 6, 2008

(54) METHOD OF FABRICATING MAGNETIC SENSORS WITH PINNED LAYERS WITH ZERO NET MAGNETIC MOMENT

(75) Inventors: Jinshan Li, San Jose, CA (US); Tsann Lin, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 441 days.

(21) Appl. No.: 11/048,259

(22) Filed: Jan. 31, 2005

(65) Prior Publication Data

US 2006/0168797 A1    Aug. 3, 2006

(51) Int. Cl.
*G11B 5/127* (2006.01)
*H04R 31/00* (2006.01)

(52) U.S. Cl. .............. 29/603.09; 29/603.11; 29/603.13; 324/252; 360/324.11; 360/324.12; 427/127; 427/128

(58) Field of Classification Search ............ 29/603.07, 29/603.09, 603.11, 603.13, 603.14; 324/252; 360/324.1, 324.11, 324.12, 324.2; 427/127–131
See application file for complete search history.

(56) References Cited

U.S. PATENT DOCUMENTS

| 5,583,725 | A | 12/1996 | Coffey et al. |
|---|---|---|---|
| 5,731,936 | A | 3/1998 | Lee et al. |
| 5,793,279 | A | 8/1998 | Nepela |
| 5,843,589 | A | 12/1998 | Hoshiya et al. |
| 5,898,549 | A | 4/1999 | Gill |
| 6,046,892 | A | 4/2000 | Aoshima et al. |
| 6,141,191 | A | 10/2000 | Lee et al. |
| 6,157,525 | A | 12/2000 | Iwasaki et al. |
| 6,222,707 | B1 | 4/2001 | Huai et al. |
| 6,278,592 | B1 | 8/2001 | Xue et al. |
| 6,292,336 | B1 | 9/2001 | Horng et al. |
| 6,473,275 | B1 | 10/2002 | Gill |
| 6,498,707 | B1 | 12/2002 | Gao et al. |
| 7,035,059 | B2 * | 4/2006 | Gill ........................ 360/324.11 |
| 2004/0042130 | A1 | 3/2004 | Lin et al. |
| 2004/0105193 | A1 | 6/2004 | Horng et al. |

FOREIGN PATENT DOCUMENTS

| WO | WO00/65578 A1 | 11/2000 |
|---|---|---|
| WO | WO03/065024 A2 | 7/2003 |

* cited by examiner

*Primary Examiner*—Paul D. Kim
(74) *Attorney, Agent, or Firm*—Zilka-Kotab, PC

(57) ABSTRACT

A method for achieving a nearly zero net magnetic moment of pinned layers in GMR sensors, such as Co—Fe/Ru/Co—Fe, is described. The method determines a thickness of the first pinned layer which will yield the desired net magnetic moment for the pinned layers. A series of test structures are deposited on a substrate such as glass. The test structures include the seed layers, pinning layers and pinned layers and have varying thicknesses of the first pinned layer. The compositions of the materials and the thicknesses of all of the other films remain constant. The net areal magnetic moment of each test structure is measured and plotted versus the thickness of the first pinned layer. The thickness of the first pinned layer which corresponds most closely to zero net areal magnetic moment is chosen as the design point for the sensor.

7 Claims, 11 Drawing Sheets

| 14B | Ta  41 |
|---|---|
| | FREE-2 Ni-Fe  33B |
| | FREE-1 Co-Fe  33A |
| | GMR SPACER Cu-O  35 |
| | Co-Fe  39T |
| | AP SPACER Ru  39S |
| | Co-(0-10)Fe  39B2 |
| | Co-(20-80)Fe  39B1 |
| | Ir-Mn-Cr  53 |
| | Ni-Fe  51C |
| | Ni-Cr-Fe  51B |
| | Al-O  51A |
| | BOTTOM GAP  32 |

Fig. 3C

METHOD OF FABRICATING MAGNETIC SENSORS WITH PINNED LAYERS WITH ZERO NET MAGNETIC MOMENT

FIELD OF THE INVENTION

The invention relates to the field of magnetic sensors (heads) and more particularly to magnetic sensors with pinned layer structures with two ferromagnetic layers.

BACKGROUND OF THE INVENTION

A typical prior art data storage system 10 used for longitudinal recording is illustrated in FIG. 1. In operation a magnetic transducer 20 is supported by a suspension (not shown) as it flies above a rotating magnetic disk 16. The magnetic transducer 20, usually called a "head" or "slider," is composed of an element that performs the task of writing magnetic transitions (the write head 23) in ferromagnetic material on the magnetic disk, and another element that performs the task of reading the magnetic transitions (the read head 12) written in the ferromagnetic material on the magnetic disk. The magnetic transducer 20 is positioned by an actuator (not shown) over points at varying radial distances from the center of the magnetic disk 16 to read and write circular tracks (not shown). The magnetic disk 16 is attached to a spindle (not shown) driven by a spindle motor (not shown) to rotate the magnetic disk 16. The magnetic disk 16 comprises a substrate 26 on which a plurality of thin films 21 are deposited. The thin films 21 include ferromagnetic material in which the write head 23 writes the magnetic transitions, and in which the read head 12 reads the magnetic transitions.

There are three main categories of read heads 12, one current-in-plane (CIP) giant magnetoresistance (GMR) heads, one current-perpendicular-to-plane (CPP) GMR heads, and the other CPP tunneling magnetoresistance (TMR) heads. In each category, there are three types of read heads 12, one a top type, one a bottom type, and the other a dual type. A typical prior art top-type CIP GMR read head 12, as illustrated in FIG. 2, includes a bottom shield layer 38, a bottom gap layer 37, a top gap layer 41, and a top shield layer 39. Within the top and bottom read gap layers 37, 41, a top-type CIP GMR sensor 14 is located in a central read region, and hard-bias/lead layers 42, 43 are disposed in two side regions.

The top-type CIP GMR sensor 14, as shown in FIG. 2, comprises a nonmagnetic seed layer 31, a ferromagnetic free (sense) layer 32, an electrically conducting spacer layer 33, a ferromagnetic pinned (reference) layer 34, an antiferromagnetic pinning layer 35, and a nonmagnetic cap layer 36. GMR effects result from different magnetization orientations of the weakly coupled ferromagnetic free and pinned layers 32, 34 separated by the electrically conducting nonmagnetic spacer layer 33. The antiferromagnetic pinning layer 35 fixes the magnetization of the pinned layer 34 in a direction perpendicular to an air bearing surface (ABS) which is an exposed surface of the GMR sensor that faces the magnetic disk (the plane of the paper in FIG. 2). In a quiescent position when a sense current is conducted through the GMR sensor 14 without magnetic field signals from an adjacent rotating magnetic disk 16, the magnetization of the free layer is preferably parallel to the ABS. During GMR sensor operation with magnetic field signals from the adjacent rotating magnetic disk 16, the magnetization of the free layer is free to rotate in positive and negative directions from the quiescent position in response to positive and negative magnetic signal fields from the moving magnetic disk 16.

In the fabrication process of the top-type CIP GMR head 12, the top-type CIP GMR sensor 14 is deposited on the bottom gap layer 37 which is deposited on the bottom shield layer 38. The GMR sensor 14 typically comprises a Ta seed layer 31, Ni—Fe/Co—Fe ferromagnetic free layers 32, a Cu spacer layer 33, a Co—Fe pinned layer 34, an antiferromagnetic Ir—Mn, Pt—Mn or Ni—Mn pinning layer 35, and a Ta cap layer 36.

Photolithographic patterning and ion milling are applied to define the read region of the GMR sensor 14. The hard-bias/leads layers 42 and 43 are then deposited in the two side regions of the GMR sensor. The hard-bias/lead layers 42, 43 preferably comprise a Cr film, a ferromagnetic Co—Pt—Cr film, a Cr film, a Rh film, and a Ta film. An electrically insulating nonmagnetic top gap layer 41 is deposited over the cap layer 36 and hard bias/leads layers 42, 43. A top shield layer 39 is formed over the nonmagnetic top gap layer 41.

In this top-type CIP GMR sensor, ferromagnetic/antiferromagnetic coupling occurs between the pinned and pinning layers, producing a unidirectional anisotropy field ($H_{UA}$). This $H_{UA}$ must be high enough to rigidly pin the magnetization of the pinned layer ($M_2$) in a transverse direction perpendicular to an air bearing surface (ABS) for proper sensor operation. Ferromagnetic/ferromagnetic coupling also occurs across the spacer layer, producing a ferromagnetic coupling field ($H_F$). This $H_F$ must be precisely controlled so that the sum of $H_F$ and a current-induced field ($H_I$) counterbalances a demagnetizing field ($H_D$) in the sense layer ($H_F+H_I=H_D$), thereby orienting the magnetization of the sense layers ($M_1$) in a longitudinal direction parallel to the ABS for optimally biased sensor operation. In a quiescent state, this GMR sensor exhibits a resistance of $R_o+R_A$, $+(1/2)R_G$, where $R_o$ is a nonmagnetic resistance, $R_A$ is the maximum anisotropy magnetoresistance (AMR) of the free layers, and $R_G$ is the maximum giant magnetoresistance (GMR). When receiving a signal field from a magnetic disk, $M_1$ rotates while $M_2$ remains unchanged. This $M_1$ rotation changes the resistance of the GMR sensor by $\pm\Delta R_G \sin\theta_1 - \Delta R_A \sin^2\theta_1$, where $\theta_1$ is the angle of $M_1$ rotation from the longitudinal direction.

When the GMR sensor is operating at elevated temperatures in the data storage system, an inadequate exchange coupling can cause canting of the magnetization of the pinned layer from the preferred transverse direction, causing malfunction of the sensor operation. The operation temperature of the GMR sensor in the data storage system can reach 180 degrees C. or more. A high $H_{UA}$ at high temperatures ensures proper sensor operation at high temperatures. This thermal stability is typically described by a blocking temperature ($T_B$), where the ferromagnetic/antiferromagnetic exchange coupling diminishes and $H_{UA}$ is zero. A higher $T_B$ typically indicates a higher $H_{UA}$ at the sensor operation temperature.

The effort to increase the GMR coefficient, $H_{UA}$ and $T_B$ is typically directed to the selection of ferromagnetic and antiferromagnetic films from various alloy systems as pinned and pinning layers. Recently, a ferromagnetic 90Co—10Fe alloy film (in atomic percent) has replaced a ferromagnetic Co film as the preferred pinned layer, in order to increase the GMR coefficient, $H_{UA}$ and $T_B$. An antiferromagnetic film selected from a Pt—Mn or Ni—Mn alloy system as a pinning layer has been extensively used in the GMR sensor.

In the selection process of an antiferromagnetic film from the Pt—Mn or Ni—Mn alloy system as a pinning layer, the Mn content of the Pt—Mn or Ni—Mn film must be carefully selected. A small difference in the Mn content leads to substantial variations in both $H_{UA}$ and $T_B$. In addition, since the Mn is the most diffusive and corrosive chemical element among all the chemical elements used in the GMR sensor, its content substantially determines the corrosion resistance and thermal stability of the GMR sensor.

In a published U.S. patent application 2004/0042130 by Lin, et al. three seed layers comprising Al—O(3 nm), Ni—Cr—Fe(3 nm) and Ni—Fe(1 nm) films are followed by the Pt—Mn pinning layer. The '130 application is commonly assigned with the present application and has a common co-inventor with the present application. The $Al_2O_3$ film used as the bottom gap layer is preferably directly sputtered in an argon gas from an alumina target, while the Al—O film used as the seed layer is preferably reactively sputtered in mixed argon and oxygen gases from an aluminum target. A pinning layer, preferably comprising a 15 nm thick Pt—Mn film, is then deposited on the seed layers. Thereafter, pinned layers are deposited on the pinning layer. The pinned layers comprise a ferromagnetic Co—Fe first pinned layer, an antiparallel (AP) Ru spacer layer, and a ferromagnetic Co—Fe second pinned layer. A spacer layer, preferably a Cu—O film, is deposited on the second pinned layer. Thereafter, free layers, preferably comprising Co—Fe and Ni—Fe films, are deposited on the Cu—O spacer layer. The cap layers, preferably comprising Cu and Ta films, are then deposited on the free layers.

SUMMARY OF THE INVENTION

A method for achieving a nearly zero net magnetic moment of pinned layers, such as Co—Fe/Ru/Co—Fe, is described. The GMR sensor with pinned layers according to the invention can be used as a top-type, bottom-type or dual-type GMR sensor in either a current-in-plane (CIP) or current-perpendicular-to-plane (CPP) GMR head. The method determines a thickness of the first pinned layer which will yield the desired net magnetic moment for the pinned layers. A series of test structures are deposited on a substrate such as glass. The test structures include the seed layers, pinning layers and pinned layers and have varying thicknesses of the first pinned layer. The compositions of the materials and the thicknesses of all of the other films remain constant. The net areal magnetic moment of each test structure is measured and plotted versus the thickness of the first pinned layer. The thickness of the first pinned layer which corresponds most closely to zero net areal magnetic moment is chosen as the design point for the sensor. With a nearly zero net magnetic moment, the pinned layers are rigidly pinned by the underlying pinning layer, and no demagnetizing field is induced. A sensor using pinned layers according to the invention can operate based on a field balance between a ferromagnetic coupling field and a current-induced field, thus simplifying a design for optimally biased sensor operation.

The first pinned layer is preferably a ferromagnetic Co—Fe film with an Fe content ranging from 20 to 40 at. % for strong exchange coupling to the Ir—Mn—Cr pinning layer. The net magnetic moment of the Co—Fe/Ru/Co—Fe pinned layers is designed to be nearly zero in order to achieve a pinning field of beyond 3,000 Oe. The composition of the Co—Fe first pinned layer is optimized in order to attain high magnetostriction needed for a high-stress-induced pinning field. A preferred embodiment is described using 77Co—23Fe for the first pinned layer and 90Co—10Fe for the second pinned layer. The preferred seed layers of Al—O/Ni—Cr—Fe/Ni—Fe and a pinning layer of Ir—Mn—Cr are used in the examples.

One preferred embodiment of a bottom-type GMR sensor according to the invention comprises:
  Al—O/Ni—Cr—Fe/Ni—Fe seed layers;
  an antiferromagnetic Ir—Mn—Cr pinning layer;
  Co—Fe/Ru/Co—Fe pinned layers;
  a Cu—O spacer layer;
  Co—Fe/Ni—Fe free layers; and
  a Ta cap layer.

One preferred embodiment of a top-type GMR sensor according to the invention comprises:
  Al—O/Ni—Cr—Fe seed layers;
  Ni—Fe/Co—Fe free layers;
  a Cu—O spacer layer;
  Co—Fe/Ru/Co—Fe pinned layers;
  an antiferromagnetic Ir—Mn—Cr pinning layer; and
  a Ta cap layer.

One preferred embodiment of a dual-type GMR sensor according to the invention comprises:
  Al—O/Ni—Cr—Fe/Ni—Fe seed layers;
  an antiferromagnetic Ir—Mn—Cr pinning layer;
  Co—Fe/Ru/Co—Fe pinned layers;
  a Cu—O spacer layer;
  Co—Fe/Ni—Fe/Co—Fe free layers;
  a Cu—O spacer layer;
  Co—Fe/Ru/Co—Fe pinned layers;
  antiferromagnetic Ir—Mn—Cr pinning layer; and
  a Ta cap layer.

BRIEF DESCRIPTION OF THE FIGURES

FIG. 3C is an illustration of selected layers of a bottom-type GMR sensor with a second embodiment of the pinned layers according to the invention as viewed parallel to an air bearing surface.

DETAILED DESCRIPTION OF THE INVENTION AND THE PREFERRED EMBODIMENTS

A. Use of 77Co—23Fe First and 90Co—10Fe Second Pinned Layers

Figure 4:
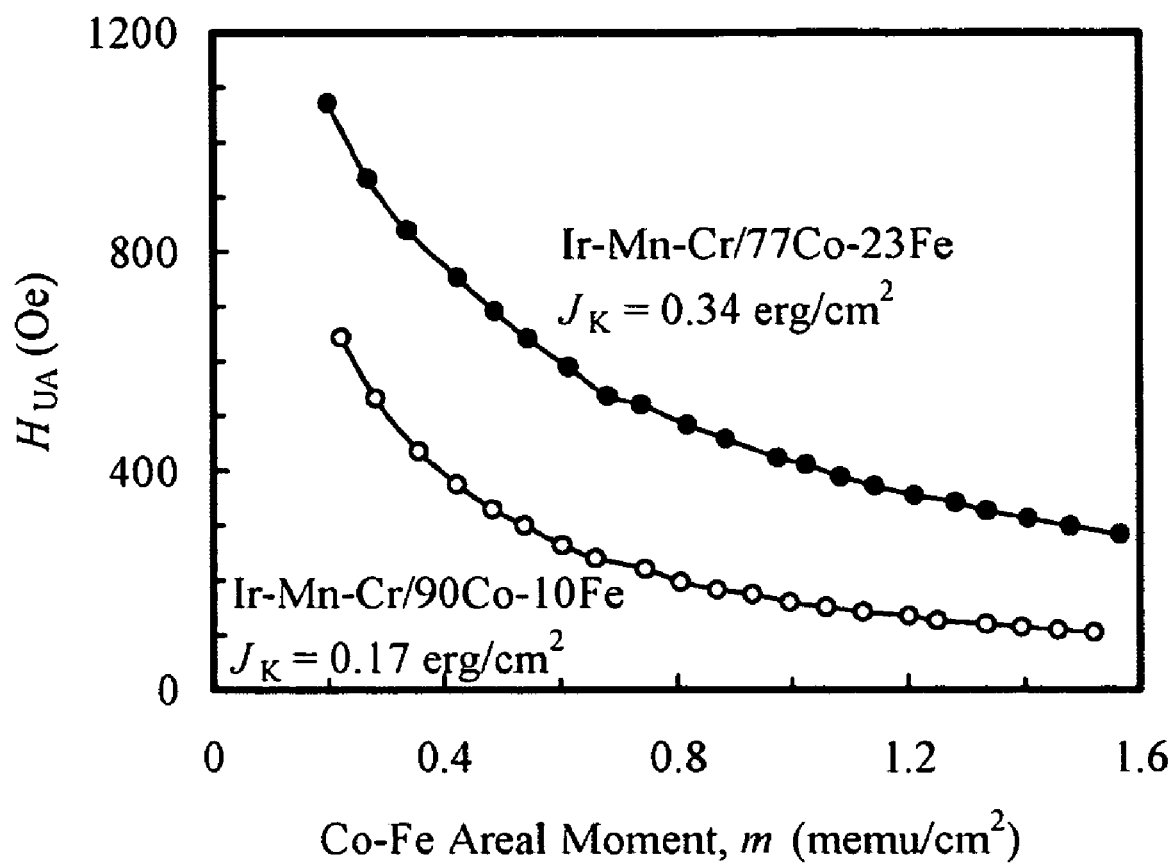
FIG. 4 is a graph of $H_{UA}$ versus the Co—Fe pinned-layer magnetic moment. The Ir—Mn—Cr(7.5 nm)/90Co—10Fe films exhibit $J_K$ of 0.17 erg/cm$^2$, while the Ir—Mn—Cr(7.5 nm)/77Co—23Fe films exhibit $J_K$ of 0.34 erg/cm$^2$.

Although the method of the invention is not limited to particular materials, a specific set of preferred materials will be used in the examples herein. The first pinned layer is preferably a ferromagnetic Co—Fe film with an Fe content ranging from 20 to 40 at % for strong exchange coupling to the preferred Ir—Mn—Cr pinning layer. The most preferred materials for the first and second pinned layers are 77Co—23Fe and 90Co—10Fe. FIG. 4 shows $H_{UA}$ versus the Co—Fe pinned-layer magnetic moment. The Ir—Mn—Cr/90Co—10Fe films exhibit $J_K$ of 0.17 erg/cm$^2$, while the Ir—Mn—Cr/77Co—23Fe films exhibit $J_K$ of 0.34 erg/cm$^2$. Hence, the 77Co—23Fe first pinned layer is preferably used for contacting the Ir—Mn—Cr pinning layer. On the other hand, it has been found that the 90Co—10Fe second pinned layer is preferably used for contacting the Cu—O spacer layer for maximizing GMR effects.

The 77Co—23Fe first pinned layer also plays a crucial role in ensuring strong pinning. It has a positive saturation magnetostriction much higher than the 90Co—10Fe pinned layer, and thus stresses induced during mechanical lapping facilitates its magnetization to be oriented in a direction perpendicular to the ABS. When the Ir—Mn—Cr GMR sensor operates at high temperatures, $H_{UA}$ becomes even lower, while this temperature-independent stress-induced pinning becomes more important for proper sensor operation. As a result, an Ir—Mn—Cr GMR sensor with the 77Co—23Fe/Ru/90Co—10Fe pinned layers is used in this preferred embodiment.

Figure 11:
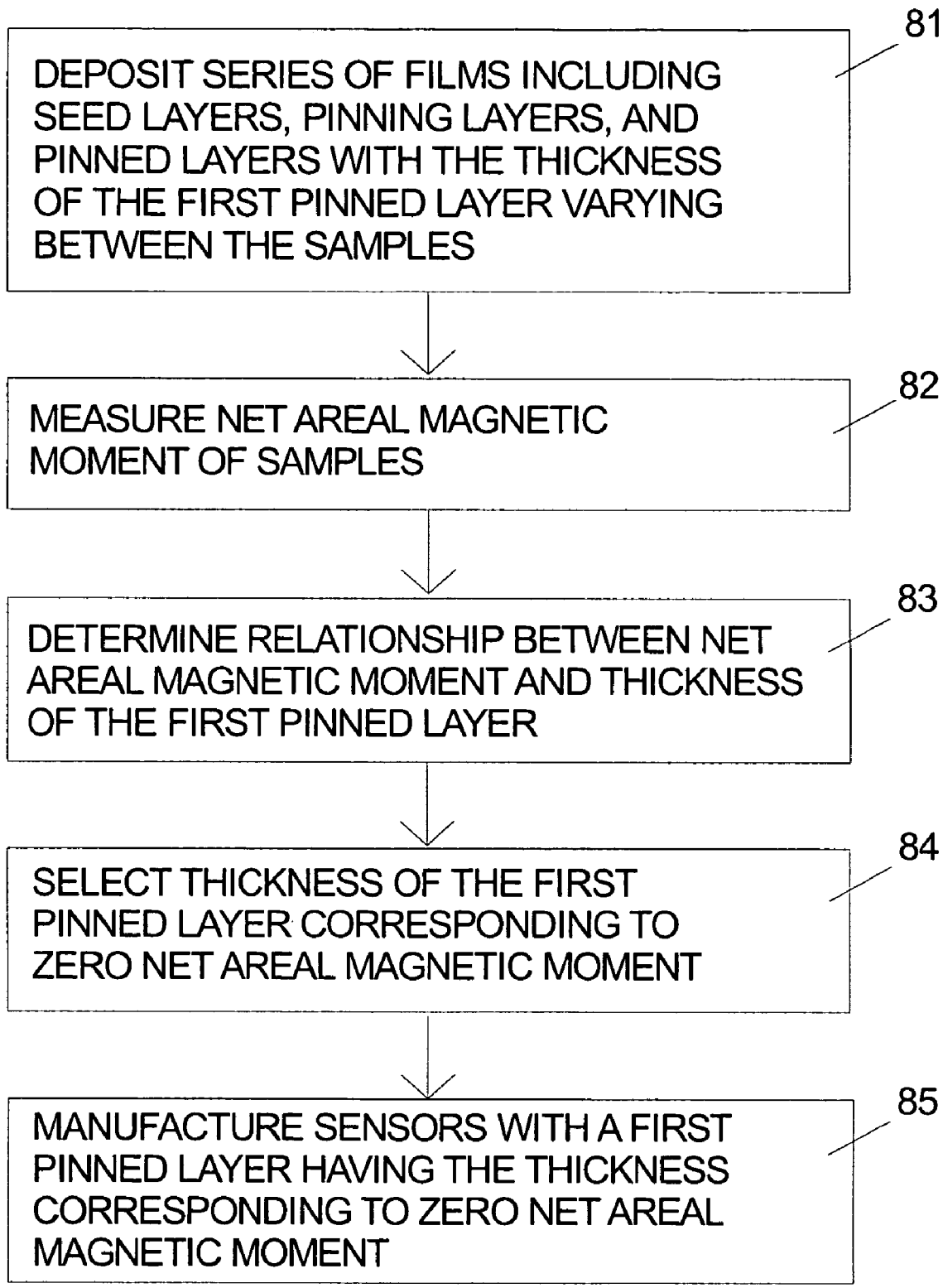
FIG. 11 is a flowchart illustrating steps in a method according to the invention.

B. Method of Zeroing Net Magnetic Moment of 77Co—23Fe/Ru/90Co—10Fe Pinned Layers The method determines a thickness of the first pinned layer which will yield the desired net magnetic moment for the pinned layers. FIG. 11 is a flowchart of the steps in a method according to the invention. A series of test structures are deposited on a substrate such as glass. The test structures include the selected seed layers, pinning layers and pinned layers for the sensor 81. The compositions of the materials and the thicknesses of all of the films remain constant except for the thickness of the first pinned layer. The thickness of the first pinned layer is varied between the samples to determine the effect of the thickness on the net areal magnetic moment. The net areal magnetic moment of each test structure is measured 82 and plotted versus the thickness of the first pinned layer 83. The thickness of the first pinned layer which corresponds most closely to zero net areal magnetic moment is chosen as the design point for the sensor 84. The sensors are then manufactured with the thickness of the first pinned layer which corresponds to zero net magnetic moment 85.

The example described herein uses the 77Co—23Fe/Ru/90Co—10Fe pinned layers. The test structure is:
seed layers: Al—O(3 nm)/Ni—Cr—Fe(3 nm)/Ni—Fe(0.4 nm);
pinning layer: Ir—Mn—Cr(7.5 nm);
pinned layer 77Co—23Fe(x nm)/Ru(0.8 nm)/90Co—10Fe(1.44 nm);
Cu—O(2.4 nm)/Ta(4 nm).

The thickness of the first pinned layer varies from approximately 0.8 nm to 2.15 nm. The films are deposited on a glass substrate in a deposition field of ~40 Oe in an integrated ion-beam/DC-magnetron sputtering system. After the depositions, the multilayer films are annealed with a field of 13,000 Oe in a direction perpendicular to the deposition field for 5 hours at 240° C.

Without the presence of the Co—Fe/Ni—Fe free layers, only the magnetic moments of the 77Co—23Fe and 90Co—10Fe pinned layers are present and can be precisely measured with a vibrating sample magnetometer. These magnetic moments cannot be calculated from their physical thicknesses and saturation magnetizations due to unknown losses in magnetic moments at Ir—Mn—Cr/77Co—23Fe, 77Co—23Fe/Ru, Ru/90Co—10Fe and 90Co—10Fe/Cu—O interfaces.

A sufficient set of samples are created and measured to determine a relationship between the net areal magnetic moment ($\Delta$m, determined by subtracting the magnetic moment of the 77Co—23Fe first pinned layer by the magnetic moment of the 90Co—10Fe second pinned layer) of the 77Co—23Fe/Ru/90Co—10Fe pinned layers and the physical thickness of the 77Co—23Fe first pinned layer. The thickness of the 77Co—23Fe first pinned layer that corresponds to a zero net magnetic moment can be determined from this linear relationship. This thickness is then selected for the fabrication of the GMR sensor. With a nearly zero net magnetic moment, the 77Co—23Fe/Ru/90Co—23Fe pinned layers are rigidly pinned by its underlying Ir—Mn—Cr pinning layer, and nearly no demagnetizing field is induced. This Ir—Mn—Cr GMR sensor can operate based on a field balance between a ferromagnetic coupling field and a current-induced field, thus simplifying a design for optimally biased sensor operation.

Figure 5:
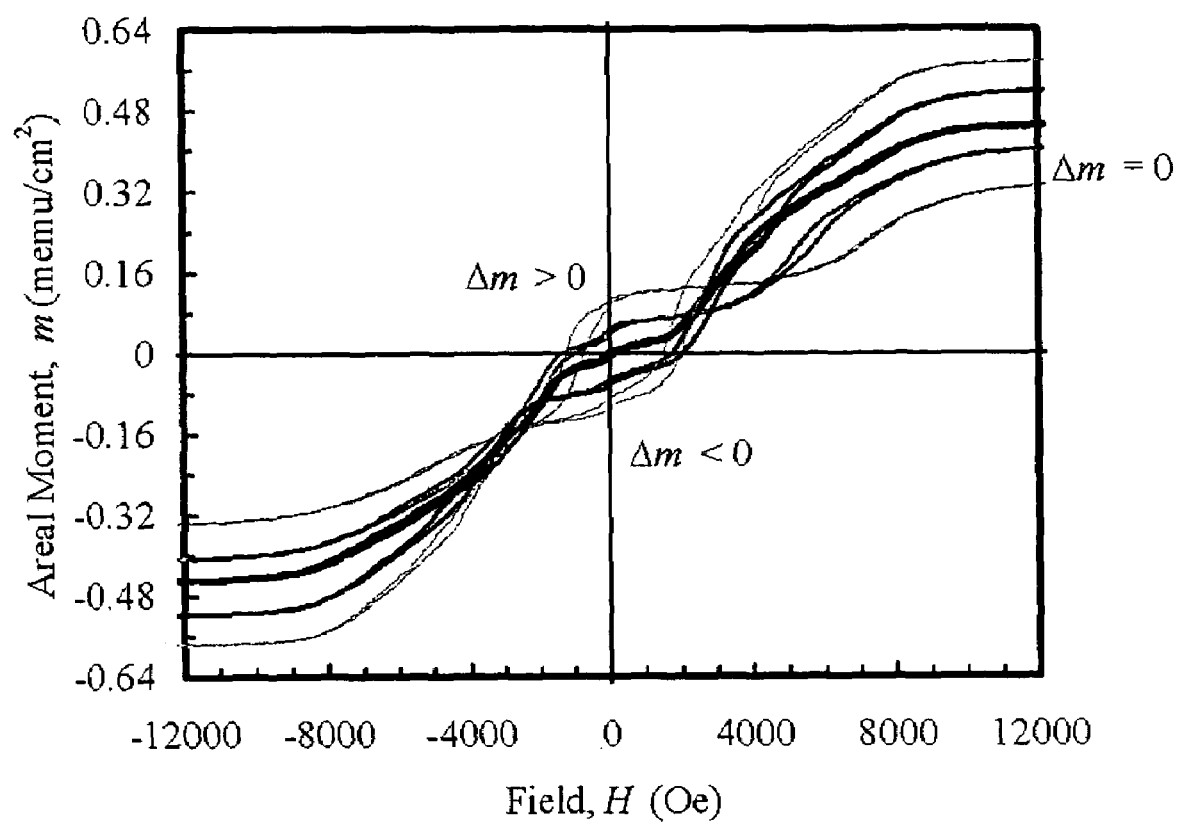
FIG. 5 is a graph of the M versus H hysteresis loops of the Al—O(3 nm)/Ni—Cr—Fe(3 nm)/Ni—Fe(0.4 nm)/Ir—Mn—Cr(7.5 nm)/77Co—23Fe/Ru(0.8 nm)/90Co—10Fe (1.44 nm)/Cu—O(2.4 nm)/Ta(4 nm) films.

As shown in FIG. 5, examination of the areal magnetic moment (m) versus the magnetic field (H) for the Al—O(3 m)/Ni—Cr—Fe(3 nm)/Ni—Fe(0.4 nm)/Ir—Mn—Cr(7.5 nm)/77Co—23Fe/Ru(0.8 nm)/90Co—10Fe(1.44 nm)/Cu—O(2.4 nm)/Ta(4 nm) films shows that antiparallel ferromagnetic/ferromagnetic coupling across the Ru spacer layer results in a hard-axis hysteresis loops corresponding to the magnetic moment of the 90Co—10Fe pinned layer, and an easy-axis hysteresis loop corresponding to the net magnetic moment of the 77Co—23Fe/Ru/90Co—10Fe pinned layers. On the other hand, antiferromagnetic/ferromagnetic coupling between the Ir—Mn—Cr pinning and 77Co—23Fe pinned layers results in the shift of the easy-axis hysteresis loop by $H_{UA}$. As a result, the hysteresis loop of the 77Co—23Fe/R/90Co—10Fe pinned layers is asymmetrical when the net magnetic moment, which can be determined at H=0, is not zero, and becomes symmetrical when the net magnetic moment is zero.

Figure 6:
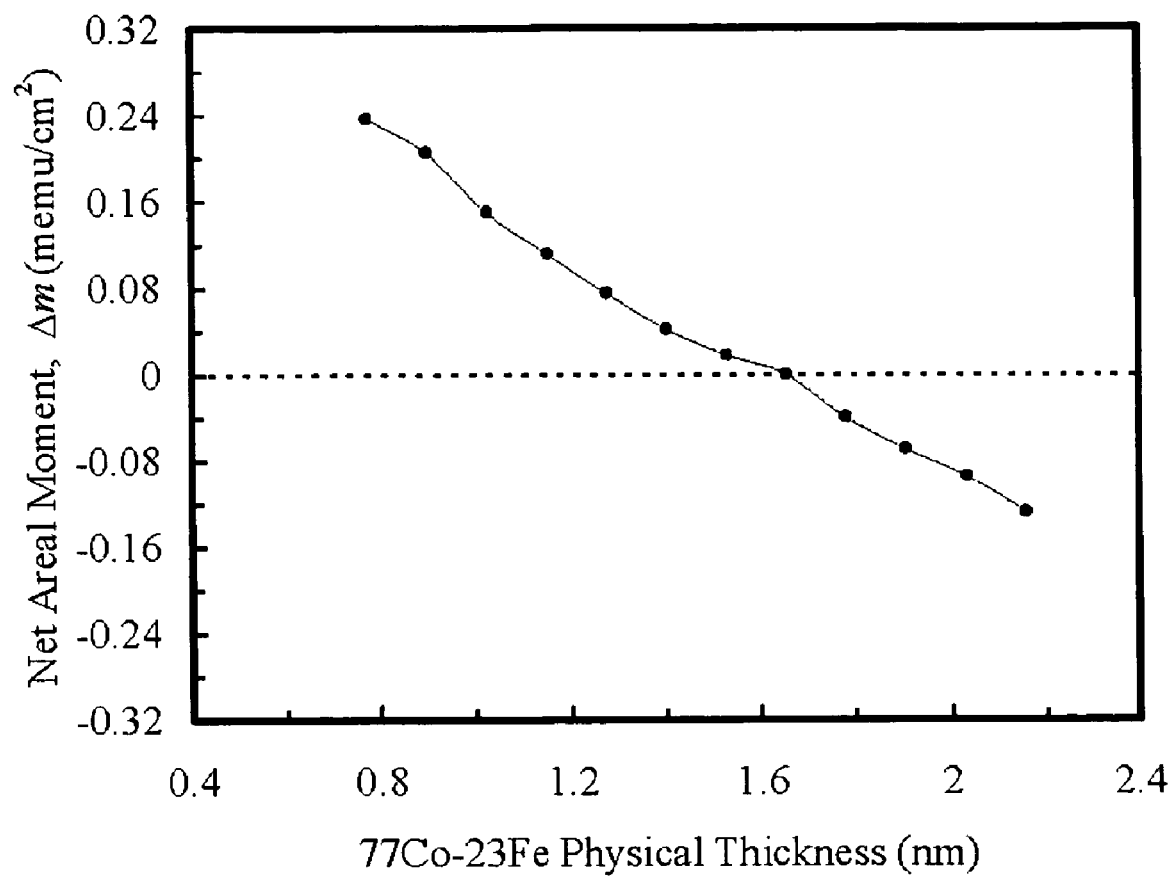
FIG. 6 is a graph of the net magnetic moment of the 77Co—23Fe/Ru(0.8 nm)/90Co—10Fe(1.44 nm) pinned layers versus the physical thickness of the 77Co—23Fe pinned layer for a series of test structures.

FIG. 6 shows the net magnetic moment of the 77Co—23Fe/Ru/90Co—10Fe pinned layers versus the physical thickness of the 77Co—23Fe first pinned layer. A linear relationship between the net moment and the 77Co—23Fe physical thickness indicates an accuracy of the method. With the 1.44 nm thick 90Co—10Fe second pinned layer, the cases of 1.15, 1.40, 1.65, 1.90 and 2.15 nm thick 77Co—23Fe first pinned layers lead to net magnetic moments of about 0.11, 0.04, 0, 0.07 and 0.13 memu/cm$^2$ (corresponding to about 1.40, 0.53, 0, 0.86 and 1.60 nm in Ni—Fe-equivalent magnetic thickness). Hence, with this method, the GMR sensor is then designed and fabricated with 77Co—23Fe(1.65 nm)/Ru(0.8 nm)/90Co—10Fe(1.44 nm) pinned layers having a nearly zero net magnetic moment, in order to attain the highest pinning field. Other Co—Fe compositions and thicknesses can be used as well by applying the method of the invention.

The GMR sensor comprising Al—O(3 nm)/Ni—Cr—Fe(3 nm)/Ni—Fe(0.4 nm) seed layers, an Ir—Mn—Cr(7.5 nm) pinning layer, 77Co—23Fe/Ru(0.8 nm)/90Co—10Fe (1.44 nm) pinned layers, a Cu—O(1.82 nm) spacer layer, Co—Fe(1 nm)/Ni—Fe(1.6 nm) free layers, and a Ta(4 nm) cap layer is then deposited on a wafer with a field of ~40 Oe in an integrated ion-beam/DC-magnetron sputtering system. After the depositions, the wafer is annealed with a field of 13,000 Oe in a direction perpendicular to the deposition field for 5 hours at 240° C.

Figure 7:
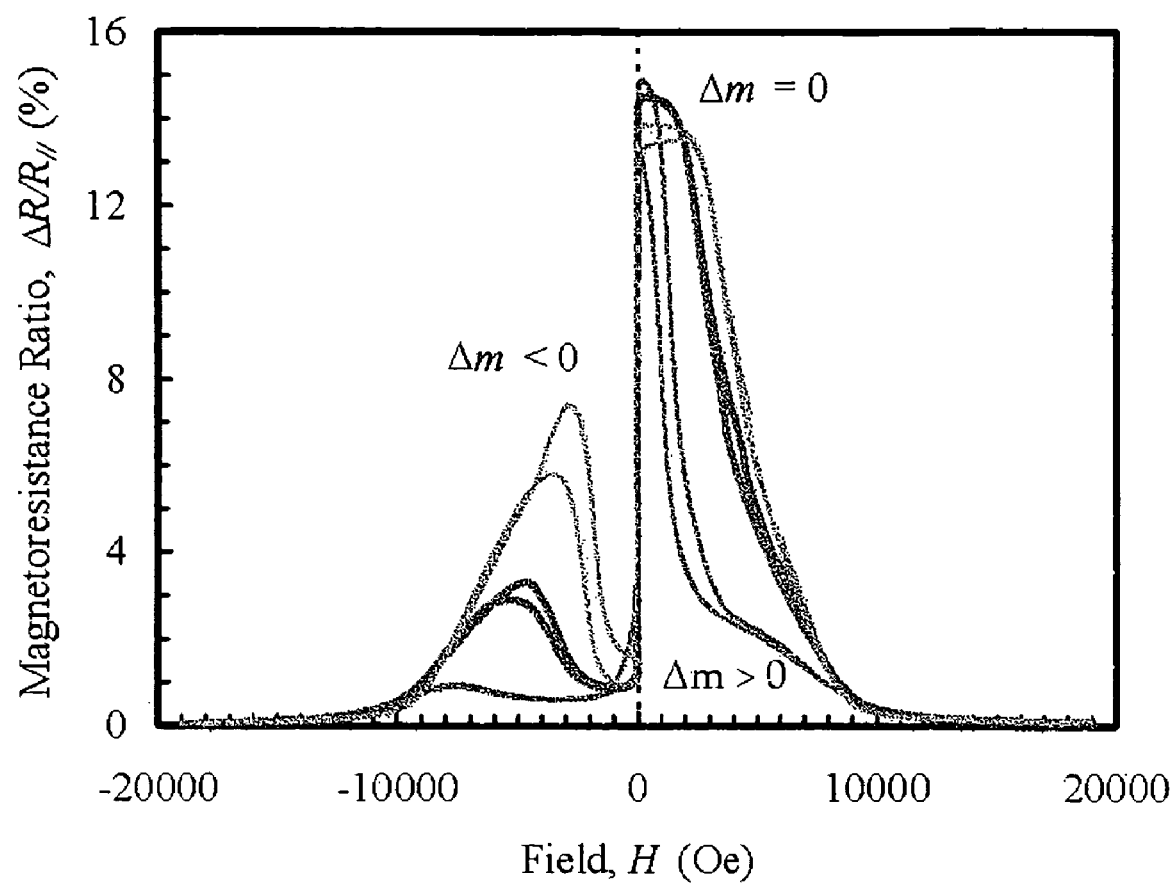
FIG. 7 is a graph of the magnetoresistance ratio ($\Delta R/R_{///}$) versus the field (H ) of the GMR sensors with the Al—O(3 nm)/Ni—Cr—Fe(3 nm)/Ni—Fe(0.4 nm)/Ir—Mn—Cr(7.5 m)/77Co—23Fe/Ru(0.8 nm)/90Co—10Fe(1.44 m)/Cu—O (1.82 nm)/Co—Fe(1 nm)/Ni—Fe(1.6 nm)/Ta(4 nm) films.

FIG. 7 shows the magnetoresistance ratio ($\Delta R/R_{//}$) versus the field (H) of the GMR sensors. The use of a 1.15 nm thick 77Co—23Fe first pinned layer leads to the appearance of a shifted easy-axis hysteresis loop on the right side. The use of a 2.15 nm thick 77Co—23Fe first pinned layer leads to the appearance of a shifted easy-axis hysteresis loop on the left side. The use of the 1.65 nm thick 77Co—23Fe first pinned layer leads to the disappearance of the easy-axis hysteresis loop, thus leading to the highest pinning field.

Figure 8:
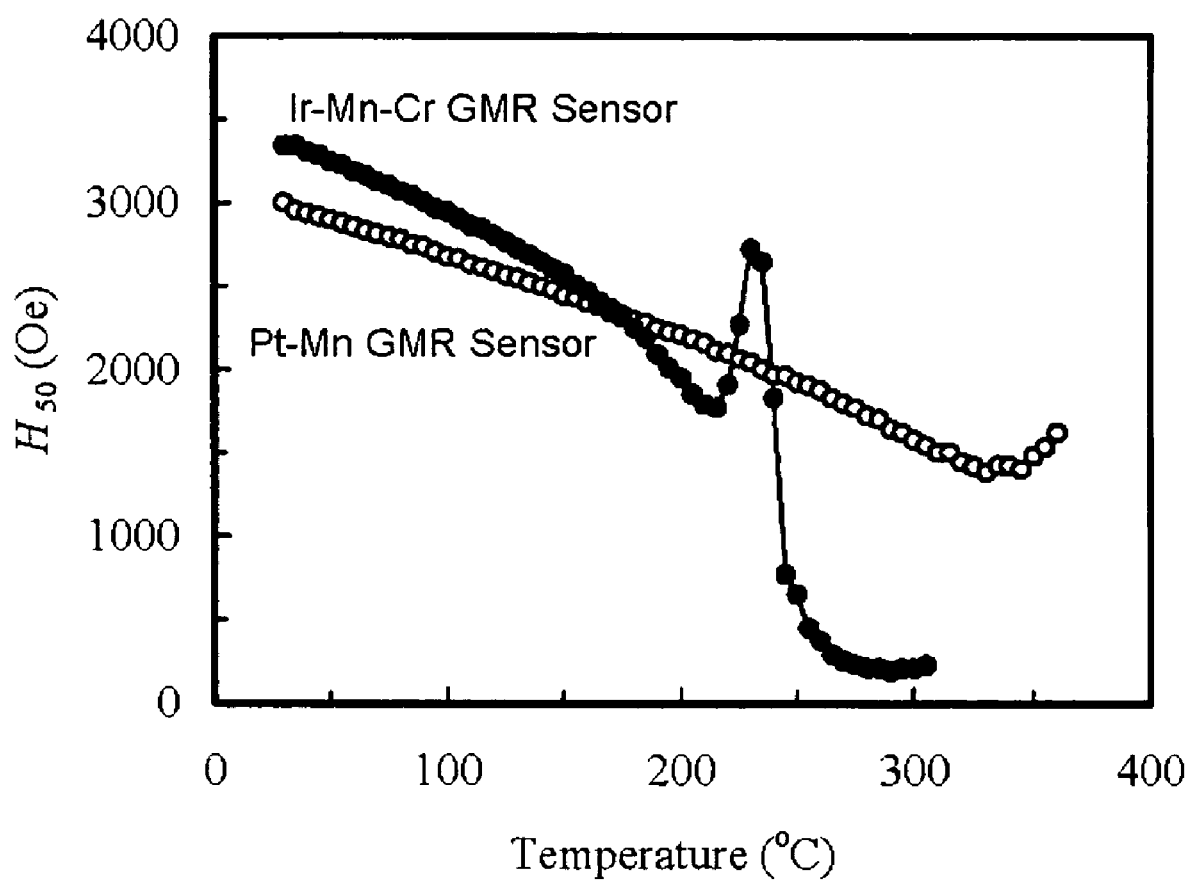
FIG. 8 shows $H_{50}$ (a pinning field defined as a field when the GMR coefficient decreases to 50% of its original value) versus temperature for an Ir—Mn—Cr GMR sensor comprising Al—O(3 nm)/Ni—Cr—Fe(3 nm)/Ni—Fe(0.4 nm)/Ir—Mn—Cr(7.5 nm)/77Co—23Fe(1.65 nm)/Ru(0.8 nm)/90Co—10Fe(1.44 nm)/Cu—O(1.82 nm)/Co—Fe(1 nm)/Ni—Fe(1.6 nm)/Ta(4 nm) and a Pt—Mn GMR sensor comprising Al—O(3 nm)/Ni—Cr—Fe(3 nm)/Ni—Fe(0.4 nm)/Pt—Mn(15 nm)/90Co—10Fe(1.6 nm)/Ru(0.8 nm)/90Co—10Fe(1.6 nm)/Cu—O(1.82 nm)/Co—Fe(1 nm)/Ni—Fe(1.6 nm)/Ta(4 nm) films.

FIG. 8 shows $H_{50}$ (a pinning field defined as a field when the GMR coefficient decreases to 50% of its original value) versus temperature for an Ir—Mn—Cr GMR sensor comprising Al—O(3 nm)/Ni—Cr—Fe(3 nm)/Ni—Fe(0.4 nm)/Ir—Mn—Cr(7.5 nm)/77Co—23Fe(1.65 nm)/Ru(0.8 nm)/90Co—10Fe(1.44 nm)/Cu—O(1.82 nm)/Co—Fe(1 nm)/Ni—Fe(1.6 nm)/Ta(4 nm) and a Pt—Mn GMR sensor comprising Al—O(3 nm)/Ni—Cr—Fe(3 nm)/Ni—Fe(0.4 nm)/Pt—Mn(15 nm)/90Co—10Fe(1.6 m)/Ru(0.8 nm)/90Co—10Fe(1.6 nm)/Cu—O(1.82 nm)/Co—Fe(1 nm)/Ni—Fe(1.6 nm)/Ta(4 nm) films. When the Ir—Mn—Cr and Pt—Mn GMR sensors operate at 160° C., the $H_{UA}$ values are comparable and as high as 2,400 Oe. Hence, the Ir—Mn—Cr GMR sensor exhibits high thermal stability comparable to the Pt—Mn GMR sensor, in spite that the Ir—Mn—Cr pinning layer itself has antiferromagnetism less thermally stable than the Pt—Mn pinning layer.

To further increase $H_{50}$, the first pinned layer may comprise two types of Co—Fe films, one with a higher Fe content (preferably ranging from 20 to 80 atomic percent) in contact with the Ir—Mn—Cr pinning layer and the other with a lower Fe content (preferably ranging from 0 to 10 atomic percent) in contact with the Ru spacer layer. The method as described above can also be used to determine a nearly zero net magnetic moment.

In this type of the GMR sensor, the $H_D$ is nearly zero, so that $H_F$ must be negative in order to counterbalance $H_I$ ($H_F=H_I$) for optimally biased sensor operation.

C. Sensor Embodiments with the Pinned Layers

Figure 1:
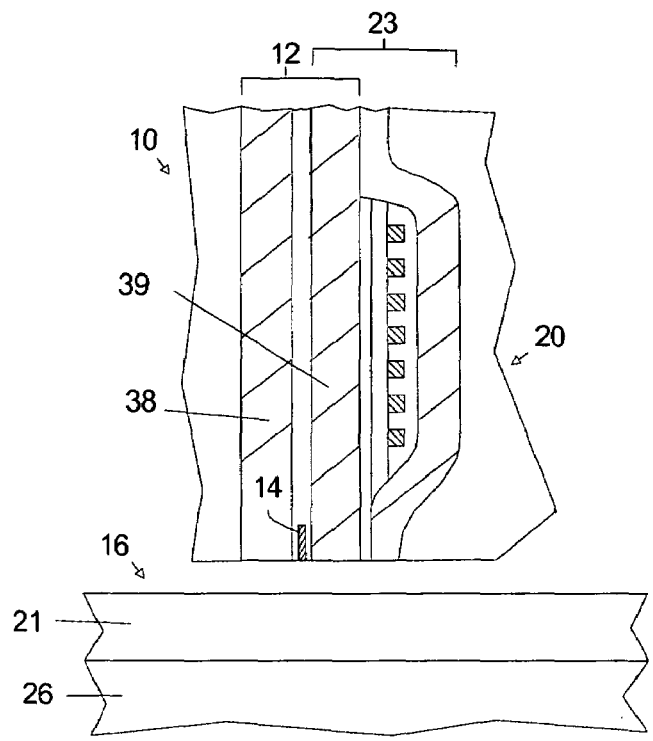
FIG. 1 is an illustration of a magnetic transducer and a magnetic disk used in a prior art data storage system.
Figure 2:
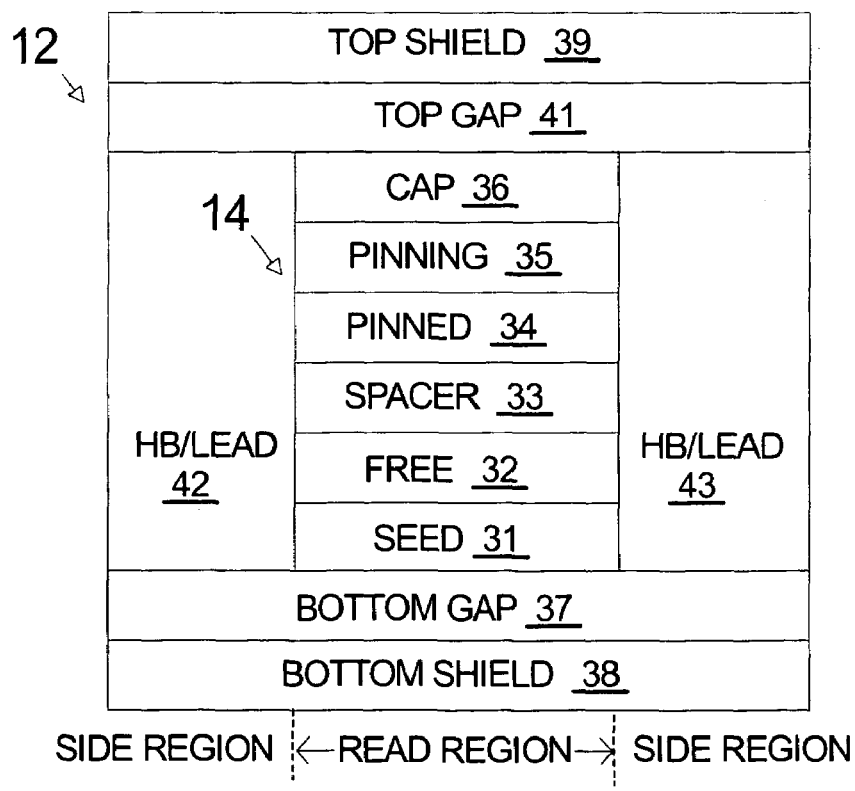
FIG. 2 is an illustration of a prior art top-type GMR sensor as viewed parallel to an air bearing surface.
Figure 3A:
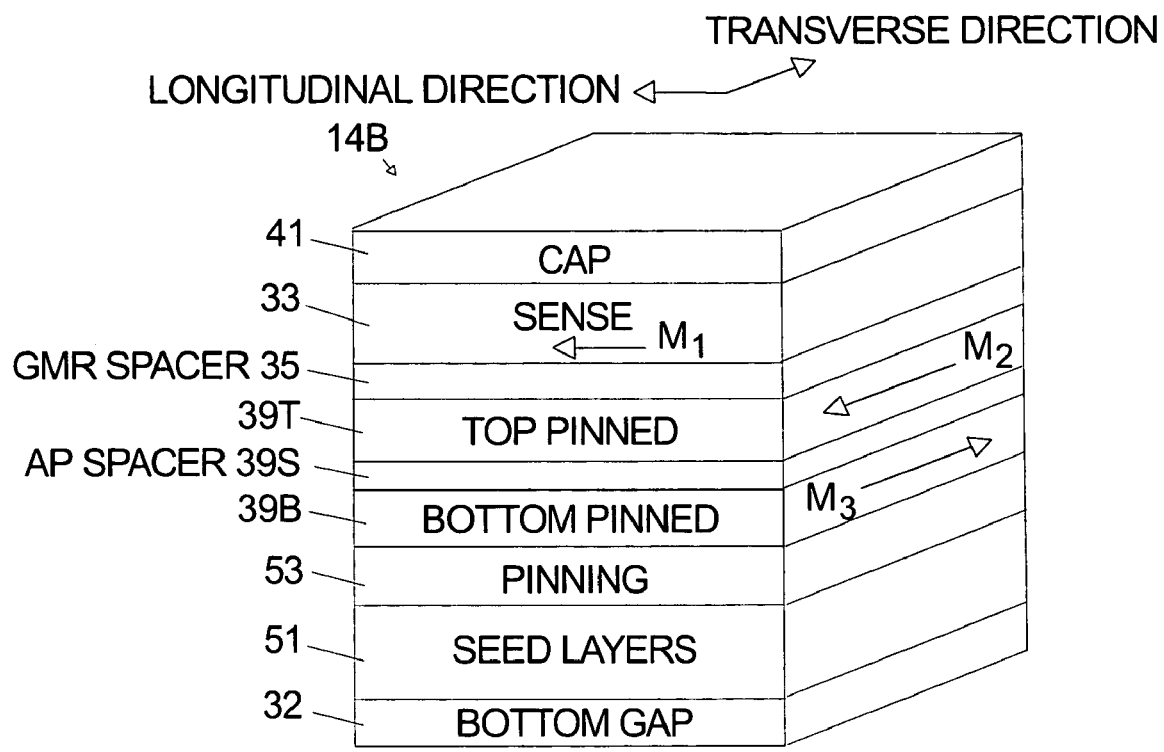
FIG. 3A is an illustration of a prior art bottom-type GMR sensor according to the invention as viewed parallel to an air bearing surface.

A bottom-type giant magnetoresistance (GMR) sensor 14B with strongly pinning and pinned layers, as shown in FIG. 3A, is described for magnetic recording at ultrahigh densities according to the invention. The GMR sensor 14B is used in a current-in-plane (CIP) storage system, and can be also used in a current-perpendicular-to-plane (CPP) storage system. The thicknesses shown in the figures are not according to scale. The thickness of the layers are according to the prior art except where note below. The bottom gap layer 32 is preferably an Al$_2$O$_3$ film deposited on the bottom shield layer (not shown). The bottom gap layer 32 is formed according to the prior art and is followed by the seed layers 51 according to the invention. The pinning layer 53 is deposited next and is followed by a first pinned layer 39B, an AP spacer layer 39S and a second pinned layer 39T. The GMR spacer layer 35 separates the second pinned layer 39T from the free (sense) layers 33. The cap layer 41 is deposited last. The remaining layers (not shown) are according to the prior art. A standard wafer used in the fabrication process typically comprises an alumina-TiC substrate coated with an alumina film deposited thereon.

Figure 3B:
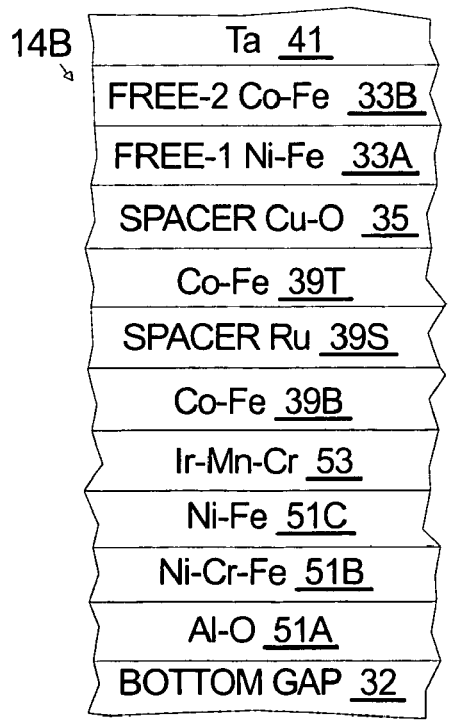
FIG. 3B is an illustration of selected layers of a bottom-type GMR sensor with a first embodiment of the pinned layers according to the invention as viewed parallel to an air bearing surface.

The seed layers 51 according to the invention include three seed layers as shown in FIG. 3B. The thicknesses given herein are not intended to be limitations, but rather are given as examples of possible embodiments. The seed layers according to the invention are deposited on a bottom gap layer 32. The first seed layer is an Al—O film 51A, which is preferably reactively sputtered in mixed argon and oxygen gases from an aluminum target. The second seed layer is a Ni—Cr—Fe film 51B. The first and second seed layers are nonmagnetic. The third seed layer is a ferromagnetic Ni—Fe film 51C. The first and second seed layers 51A, 51B can each be about 3 nm thick. The third seed layer 51C can be about 1 nm thick. The three seed layers are sequentially deposited preferably by a vacuum deposition process such as ion-beam or DC-magnetron sputtering. The seed layer combination according to the invention is believed to act to coarsen the grain size in the crystalline grains which are grown upon it.

A pinning layer 53 is deposited onto the third seed layer 51C. The pinning layer 53 is preferably an antiferromagnetic Ir—Mn—Cr film, which can be about 7.5 nm thick. The Ir—Mn—Cr pinning layer can be deposited by standard techniques such as sputter deposition from an Ir—Mn—Cr target. The pinned layers comprise a first pinned layer 39B preferably made of a 77Co—23Fe film, an AP spacer layer 39S preferably made of a ruthenium (Ru) film, and a second pinned layer 39T preferably made of a 90Co—10Fe film. The net magnetic moment of the 77Co—23Fe/Ru/90Co—10Fe pinned layers is designed to be nearly zero in order to achieve a pinning field of beyond 3,000 Oe. The composition of the 77Co—23Fe first pinned layer 39B below the Ru spacer layer is selected after optimization for attaining high magnetostriction needed for a high-stress-induced pinning field. Recording testing of the GMR sensor according to the invention has shown a high signal amplitude and high thermal stability.

To exhibit needed antiferromagnetism, the prior art Pt—Mn pinning layer must be as thick as 15 nm, but the Ir—Mn—Cr pinning layer 53 can be as thin as 5 nm when used with seed layers according to the invention. The Mn content of the prior art Pt—Mn pinning layer must be selected from a narrow composition range (from 49 at % to 52%), but the Mn and Cr contents of the Ir—Mn—Cr pinning layer can be selected from wide composition ranges (from 70 to 80 at % and from 0 to 10 at %, respectively). The Cr element adds high corrosion resistance to the Ir—Mn—Cr film. The antiferromagnetism remains strong even when the Mn content reaches as low as 70 at % and the Cr content reaches as high as 10 at. %. A lower Mn content and a higher Cr content facilitate further improvements in the corrosion resistance.

The 90Co—10Fe/Ru/90Co—10Fe pinned layers commonly used in the prior art have a non-zero net magnetic moment. According to the invention, a Co—Fe pinned layer with an Fe content ranging from 10 to 90 at % is used to contact the Ir—Mn—Cr pinning layer for the top-type, bottom-type and dual-type GMR sensor. More preferably, with an Fe content ranging from 30 to 70 at %, the GMR sensor exhibits a high unidirectional anisotropy field ($H_{UA}$) and a high saturation magnetostriction ($\lambda_S$). The Co—Fe first pinned layer 39B is thus strongly pinned by its underlying Ir—Mn—Cr pinning layer 53 and by stresses induced in the head fabrication process. As a result, its magnetization will not be rotated until an external field exceeds the sum of pinning fields determined by both the $H_{UA}$ and $\lambda_S$.

A preferred embodiment of the invention uses the 77Co—23Fe/Ru/90Co—10Fe pinned layers with a nearly zero net magnetic moment. The $H_{UA}$ artificially increases with decreasing the net magnetic moment, and becomes nearly infinite when the net magnetic moment reaches zero. As a result, the 77Co—23Fe/Ru/90Co—10Fe pinned layers with a nearly zero net magnetic moment is rigidly pinned by its underlying Ir—Mn—Cr pinning layer, and their magnetizations will not be rotated until an external field exceeds the sum of pinning fields determined by a spin-flop field across the Ru spacer layer ($H_{SP}$) and $\lambda_S$. A method of zeroing the net magnetic moment of the 77Co—23Fe/Ru/90Co—10Fe pinned layers, which plays a very crucial role in the viability of this GMR sensor, will be described.

In the prior art, the GMR sensor is operated based on a balance among a demagnetizing field (induced by a net magnetic moment), a ferromagnetic coupling field and a current-induced field. In this invention, the demagnetizing field is nearly zero due to a nearly zero net magnetic moment. As a result, the GMR sensor is operated based on a field between the ferromagnetic coupling field and the current-induced field. Therefore, it is easier to design a GMR sensor according to the invention for magnetic recording at ultrahigh densities.

One embodiment has a GMR sensor comprising an Al—O seed layer 51A of about 3 nm, a Ni—Cr—Fe seed layer 51B of about 3 nm, a Ni—Fe seed layer 51C of about 0.4 nm, an Ir—Mn—Cr pinning layer 53 of about 7.5 nm, a 77Co—23Fe first pinned layer 39B of about 1.65 nm, a Ru spacer layer 39S of about 0.8 nm, a 90Co—10Fe second pinned layer 39T of about 1.44 nm; a Cu—O spacer layer 35 of about 1.82 nm; a 90Co—10Fe first free layer 33A of about 1 nm, a 90Ni—10Fe second free layer 33B of about 1.6 nm; and a Ta cap layer 41 of about 4 nm. The GMR sensor is deposited on a wafer in an integrated ion-beam/DC-magnetron sputtering system. The depositions of Ni—Fe and Co—Fe ferromagnetic films are conducted with a deposition field of ~40 Oe, while the depositions of the other non-ferromagnetic films are conducted without the deposition field. After the depositions, the GMR sensor is annealed in a magnetic field in a direction perpendicular to the deposition field. This anneal is needed to thermally set the magnetizations of 77Co—23Fe/Ru/90Co—10Fe pinned layer in the direction perpendicular to the deposition field for proper sensor operation.

FIG. 3C illustrates an embodiment of the bottom-type GMR sensor with two layers 39B1, 39B2 for the first pinned layer. The portion of the first pinned layer 39B1 in contact with the Ir—Mn—Cr pinning layer is preferably Co—Fe with 20-80 atomic percent Fe. The portion of the first pinned layer 39B2 in contact with the Ru spacer layer is preferably Co—Fe with 0-10 atomic percent Fe.

Figure 9:
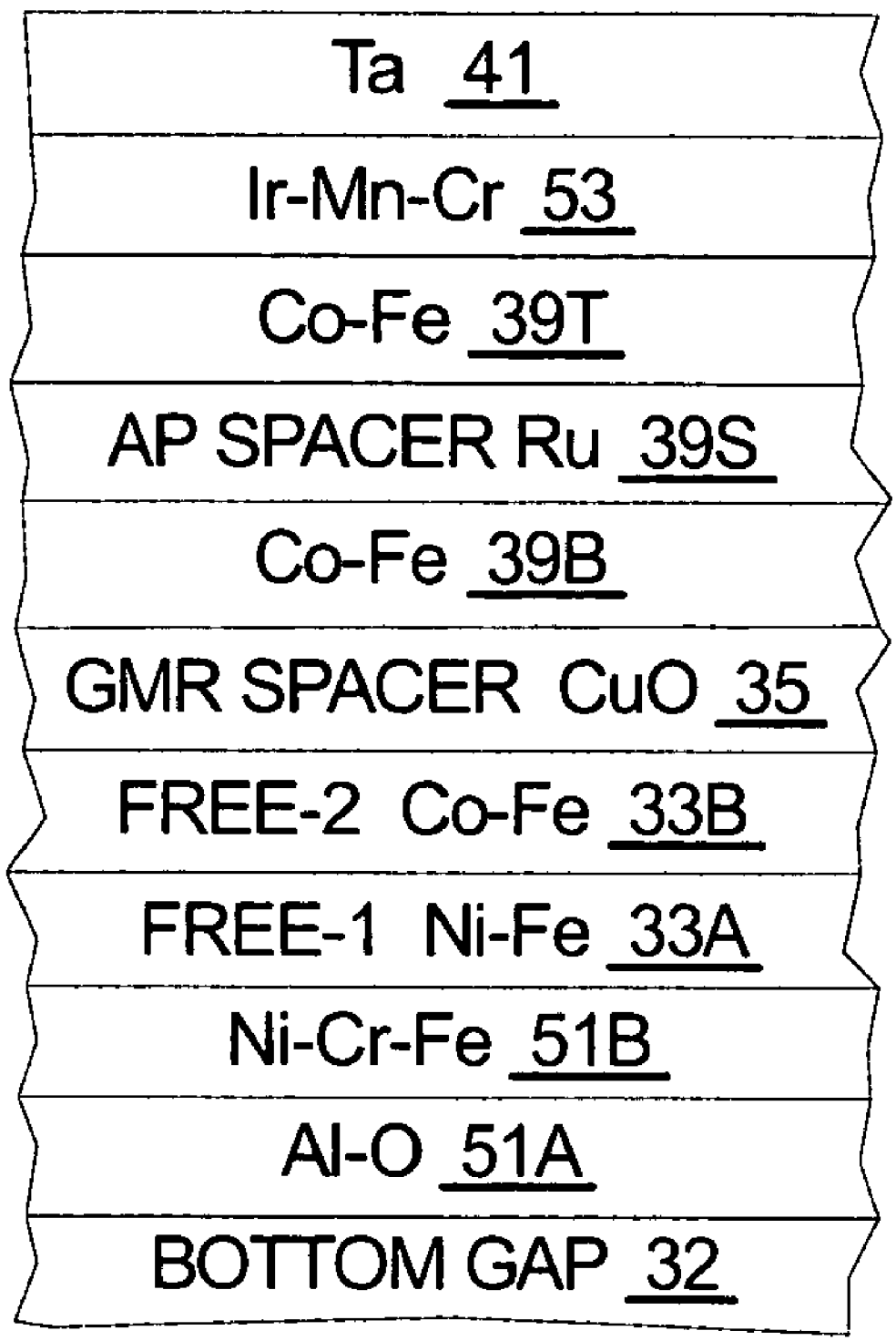
FIG. 9 is an illustration of selected layers of a top-type GMR sensor according to the invention as viewed parallel to an air bearing surface.

FIG. 9 illustrates a preferred embodiment of a top-type GMR sensor according to the invention. In this embodiment there are only two seed layers (Al—O/Ni—Cr—Fe), since the first free layer 33A is a ferromagnetic Ni—Fe film, which also acts as the ferromagnetic Ni—Fe third seed layer. The layers in this embodiment are:
   Al—O/Ni—Cr—Fe seed layers 51A, 51B;
   Ni—Fe/Co—Fe free layers 33A, 33B;
   a Cu—O spacer layer 35;
   Co—Fe/Ru/Co—Fe pinned layers 39B, 39S, 39T;
   a antiferromagnetic Ir—Mn—Cr 53; and
   a Ta cap layer 41.

The first pinned layer 39B can be replaced two layers 39B1, 39B2 for the first pinned layer as shown in FIG. 3C.

Figure 10:
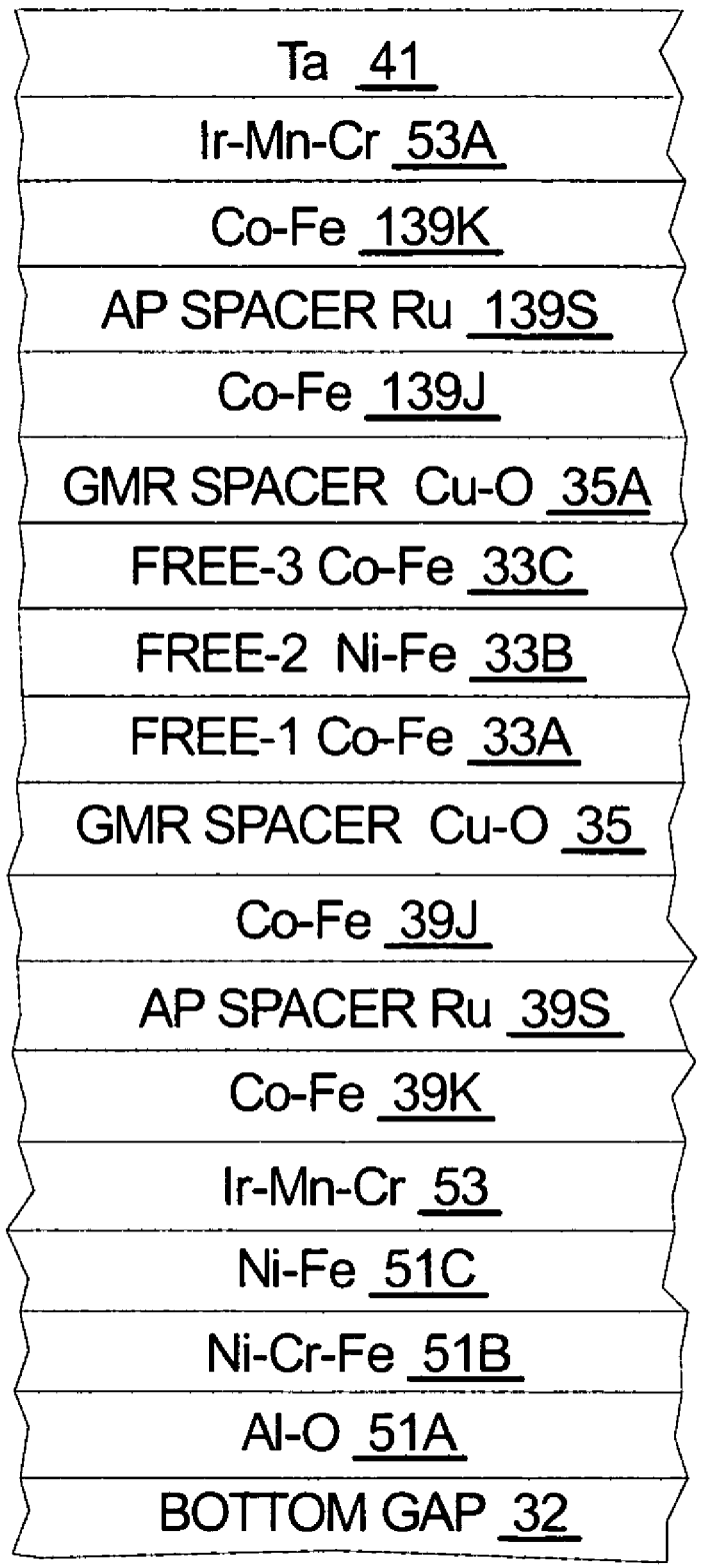
FIG. 10 is an illustration of selected layers of a dual-type GMR sensor according to the invention as viewed parallel to an air bearing surface.

FIG. 10 illustrates a preferred embodiment of a dual-type GMR sensor according to the invention. The layers in this embodiment are:
   Al—O/Ni—Cr—Fe/Ni—Fe seed layers 51A, 51B, 51C;
   an antiferromagnetic Ir—Mn—Cr first pinning layer 53;
   a first set of Co—Fe/Ru/Co—Fe pinned layers 39K, 39S, 39J;
   a Cu—O first spacer layer 35;
   Co—Fe/Ni—Fe/Co—Fe free layers 33A, 33B, 33C;
   a Cu—O second spacer layer 35A;
   a second set of Co—Fe/Ru/Co—Fe pinned layers 139J, 139S, 139K;
   an antiferromagnetic Ir—Mn—Cr second pinning layer 53A; and
   a Ta cap layer 41.

The compositions given herein have been described without regard to small amounts of impurities that are inevitably present in practical embodiments as is well known to those skilled in the art. Although the embodiments of the invention have been described in a particular GMR sensor environment, those skilled in the art will recognize that the invention may be used in other magnetic transducer configurations.

The invention claimed is:

1. A method of fabricating a GMR sensor comprising the steps of:
   fabricating a set of samples having:
   on or more seed layers;
   a pinning layer;
   a ferromagnetic first pinned layer deposited on the pinning layer, the ferromagnetic first pinned layer varying in thickness between the samples;
   a nonmagnetic antiparallel (AP) spacer layer deposited on the first pinned layer; and
   a ferromagnetic second pinned layer deposited on the AP spacer layer;
   measuring a net area magnetic moment of the first and second pinned layers in the set of samples to determine a relationship between the net areal magnetic moment and the thickness of the first pinned layer, and to determine thicknesses of the first pinned layers yielding approximately zero net areal magnetic moment; and
   manufacturing the GMR sensor with the one or more seed layers, the pinning layer and first and second pinned layers with the thickness of the first pinned layer yielding approximately the zero net areal magnetic moment;

wherein the first pinned layer comprises first and second Co—Fe films, the first Co—Fe film contacting the AP spacer layer and having an Fe content of approximately from 0 to 10 atomic percent, and the second Co—Fe film contacting the pinning layer and having an Fe content of approximately from 20 to 80 atomic percent.

2. The method of claim 1 wherein the set of samples further includes a nonmagnetic Cu—O GMR spacer layer deposited on the second pinned layer, and a nonmagnetic Ta cap layer deposited on the GMR spacer layer.

3. The method of claim 1 wherein the pinning layer is Ir—Mn—Cr.

4. The method of claim 1 wherein the one or more seed layers include:

a nonmagnetic Al—O first seed layer;

a nonmagnetic Ni—Cr—Fe second seed layer deposited on the first seed layer; and a ferromagnetic Ni—Fe third seed layer deposited on the second seed layer.

5. The method of claim 1 wherein the first pinned layer has an Fe content of approximately from 20 to 40 atomic percent.

6. The method of claim 1 wherein the second pinned layer has an Fe content of approximately 10 atomic percent.

7. The method of claim 1 wherein the GMR is a dual-type.

* * * * *

UNITED STATES PATENT AND TRADEMARK OFFICE
CERTIFICATE OF CORRECTION

PATENT NO. : 7,367,109 B2  Page 1 of 1
APPLICATION NO. : 11/048259
DATED : May 6, 2008
INVENTOR(S) : Li et al.

It is certified that error appears in the above-identified patent and that said Letters Patent is hereby corrected as shown below:

column 10, line 16 "a antiferromagnetic" should read --an antiferromagnetic-- column 10, line 48 claim 1 "on or more seed layers" should read --one or more seed layers--

Signed and Sealed this

Twenty-first Day of July, 2009

JOHN DOLL
*Acting Director of the United States Patent and Trademark Office*